(12) United States Patent
Gogolides et al.

(10) Patent No.: US 6,296,989 B1
(45) Date of Patent: Oct. 2, 2001

(54) SILYLATION OF EPOXY-CONTAINING PHOTORESIST FILMS

(75) Inventors: Evangelos Gogolides; Evangelia Tegou, both of Athens; Panagiotis Argitis; Michael Hatzakis, both of Attiki, all of (GR)

(73) Assignee: National Center for Scientific Research "Demokritos", Attiki (GR)

( * ) Notice: Subject to any disclaimer, the term of this patent is extended or adjusted under 35 U.S.C. 154(b) by 0 days.

(21) Appl. No.: 09/152,046

(22) Filed: Sep. 11, 1998

(51) Int. Cl.$^7$ ............................................ G03C 5/00
(52) U.S. Cl. ..................... 430/322; 430/325; 430/330
(58) Field of Search .................................. 430/322, 325, 430/330

(56) References Cited

U.S. PATENT DOCUMENTS

| | | | |
|---|---|---|---|
| 5,041,362 | * 8/1991 | Douglas | 430/313 |
| 5,275,920 | * 1/1994 | Sezi et al. | 430/315 |
| 5,312,717 | * 5/1994 | Sachdev et al. | 430/313 |
| 5,384,220 | * 1/1995 | Sezi et al. | 430/8 |
| 5,466,729 | 11/1995 | Guillet et al. | 523/421 |
| 5,756,256 | * 5/1998 | Nakato et al. | 430/272.1 |

OTHER PUBLICATIONS

Resist Patterning by Dry Development, Research Disclosure 304106, Disclosed Anonymouse, Aug. 1989.*
Nishikubo, T., et al., "Novel Synthesis of Poly(silyl ether)s by the Addition of Bis(epoxide)s with Dichlorosilanes or Bis(chlorosilane)s," *Macromolecules* 28:4361–4365 (1995).
Gogolides, E., et al., "Surface Silylation and Oxygen Plasma Etching of Epoxidised Novolac Photoresists for Microlithographic Applications," (1996).

* cited by examiner

*Primary Examiner*—Steven P. Griffin
*Assistant Examiner*—Jonas N. Strickland
(74) *Attorney, Agent, or Firm*—Hamilton, Brook, Smith & Reynolds, PC

(57) ABSTRACT

A high resolution pattern transfer processes is described, whereby epoxy containing photoresist films are imagewise exposed to radiation, baked to crosslink the exposed areas, and treated with a silylating medium, which reacts with the epoxy ring thereby incorporating silicon at will in the non-crosslinked regions of the film, while making those regions resistant to oxygen atom-containing plasmas.

28 Claims, No Drawings

SILYLATION OF EPOXY-CONTAINING PHOTORESIST FILMS

BACKGROUND OF THE INVENTION

Pattern transfer is used for the fabrication of integrated circuits, microsystems, integrated sensors, and micromachined devices. Pattern transfer is comprised of two processes: lithography and etching. In lithography, the pattern to be transferred to a substrate is first transferred onto a polymer film referred to as photoresist film. The film is exposed to some form of radiation, and usually heat-treated after the exposure. Chemical changes in the polymer film are such that exposed areas can be differentiated from dark areas by treatment (wet development) in an appropriate solution. Development either removes the exposed regions (positive-tone process) or the unexposed regions (negative-tone process). This reveals the underlying substrate in some areas, while masking it in other areas.

The etching process is usually done in a plasma discharge, which etches away the substrate in the areas not masked by the remaining photoresist film. The etching must be anisotropic, ie., directed preferentially in one direction perpendicular to the surface of the substrate, in order to maintain the fidelity and the line width of the transferred pattern. Details of the patterning process can be found in many books, such as W. M. Moreau *Semiconductor Lithography, Principles, Practices and Materials*, Plenum Press 1992, which is incorporated herein in its entirety by this reference.

Photoresist films must have appropriate absorbance (typically less than 0.5) in order to be imaged to their entire depth. However, lithography is usually done on non-flat substrates with topography, where the resist thickness varies from one place on the substrate to another. As a result, line-width variations and limitations in the resolution of lithography occur, due for example to reflective notching. In other cases, the photoresist film is not transparent to radiation, as is the case, for example, with aromatic polymer-based photoresists and UV radiation below 200 nm. It is thus often advantageous both for highly and for non-absorbing photoresists to image with the radiation only the top part of the photoresist film (surface imaging).

Photoresist films must also have good plasma resistance, in order to protect the underlying substrate in the masked areas during the plasma-etching step. Since the etch resistance of organic, and especially aliphatic photoresists, is small, it is often advantageous to use organometallic photoresists (e.g. silicon containing), or to incorporate silicon in situ selectively in the photoresist film (silylation reaction), rendering the material resistant to oxygen or chlorine plasma.

To accommodate the above described advantages and/or the needs for surface imaging, and plasma resistance of photoresists, two approaches are often used:

1. A bilayer approach. Here the substrate is first covered with a thick planarizing organic polymer. On top of this polymer, a thin photoresist film is coated, exposed and wet developed. If the photoresist is an organometallic material (see for example M. Hatzalis, J. Paraszczak, J. Shaw, Proc. Microcircuit Engnrg. Lausane, page 396, 1981 for organo-silicon materials), the structure can be dry-developed in an oxygen plasma. the areas of the planarizing polymer that are masked by the organosilicon photoresist are protected, while the others are etched away. Thus, the image is first transferred (etched) on the polymer layer, before the etching of the substrate is performed. If the photoresist does not contain silicon or other element that can form an in situ mask in an oxygen plasma, a silylation or other element compound treatment follows the wet development of the top photoresist. (see for example J. M. Shaw, M. Hatzakis, E. D. Babich, J. R. Paraszczak, D. F. Witman, K. J. Stewart, J. Vac. Sci. Technol. B 7 (6), 1709 (1989), U.S. Pat. Nos. 5,384,220 to Sezi et al, and 4,931,351 to McColgin et al., which are incorporated herein by this reference). 2) A single layer surface silylation process: Here after the exposure of the photoresist film, and usually following a heat treatment, differentiation exists between the exposed and the dark areas concerning their ability to react with the silylating agent. Exposed or unexposed regions can become crosslinked posing a diffusion barrier to the silylating agent (see for example U.S. Pat. No 5,312,717 to Sachdev, which is incorporated herein by this reference). Alternatively reactive functionalities are created or destroyed in the photoresist upon exposure (see for example U.S. Pat. No. 4,810,601 to Allen, which is incorporated herein by this reference). The photoresist is then treated with the silylating medium, which selectively silylates the exposed or the dark areas.

In both cases, the dry development of the bottom planarizing photoresist or non silylated part the silylated photoresist are done in an oxygen-atom containing plasma, in a reactive ion etcher or a high density plasma etcher apparatus with or without magnetic confinement. In addition to oxygen atoms, other atoms or gases can be present in the plasma to give the required anisotropy during the plasma-etching step. For example sulfur dioxide can be used for anisotropy (M. Pons, J. Pelletier, 0. Joubert, J. Appl. Phys. 75 (9), 4709 (1994), which is incorporated herein by this reference), or hydrogen liberating gases for avoidance of filament formation at the line edges of the patterns (see U.S. Pat. No. 5,041,362 to Douglas, which is incorporated herein by this reference). Moreover, the dry development is usually done in two steps. First, a short treatment with a plasma containing oxygen- and fluorine-liberating gases is performed, in order to remove the unwanted small quantities of silicon that have been incorporated in the crosslinked or non reacting areas and improve the silylation selectivity between exposed and dark areas. Secondly, a longer treatment with the oxygen plasma is performed (See E. Gogolides, D. Tzevelekis, S. Grigoropoulos, E. Tegou, and M. Hatzakis, J.Vac. Sci. Technol., B 14 (5), 3332 (1996), which is incorporated herein by this reference). Important is also the temperature of the photoresist during etching be kept low, since at temperatures greater than the glass transition temperature ($T_g$) of the silylated resist, resist flow and pattern deformation can occur. Low temperature is also important for good anisotropy (M. Pons, J. Pelletier, O. Joubert, P. Paniez, Jpn. J. Appl. Phys. 34 Pt 1 No 7A, 3723 (1995), which is incorporated herein by this reference). Some workers also use cryogenic temperatures in order to ensure very high anisotropy.

SUMMARY OF THE INVENTION

While extensive work has been done for hydroxyl (OH) containing photoresists using silamines, (see for example U.S. Pat. Nos. 4,882,008 to Garza et al and 5,707,783 to. Stauffer et al., which are incorporated herein by this reference), no work has been done to our knowledge for the silylation of epoxy containing photoresists. Yet, epoxy containing photoresists are used in industry and research. For example. COP is a commercial aliphatic epoxy-containing electron beam lithography resist used for mask making (W. Moreau, 1992); SU8 is an epoxy resist supplied by Microlithography Chemical Corporation (Massachusetts, USA) for microsystems and micromachining; EPR (epoxidized resist) is an experimental e-beam and x-ray resist supplied by the Institute of Microelectronics NCSR Demokritos. However, since epoxy resins are used extensively in emulsions or other dispersions for coating applications, their silylation has been attempted successfully in solution, emulsion or dispersion (see for example U.S. Pat. No. 5,466,729 to Guillet et al, which is incorporated herein by this reference). In particular, a patent has been granted for silylation in solution of epoxy polymers for producing an organosilicon photoresist which was used as a top layer in a negative-tone bilayer process (see U.S. Pat. No. 5,041,358 to Hatzakis et al., which is incorporated herein by this reference). However, no one appears to have provided for in situ silylation of an epoxy photoresist film for single layer positive tone imaging.

It has be speculated and shown from FTIR spectroscopy that such a silylation process of epoxy-containing photoresists is possible on a film by reacting EPR resist with a octylchlorosilane solution (E. Gogolides et al., Abstract book of $6^{th}$ European Polymer Federation Symposium on Polymeric materials, Crete Greece, October 1996, which is incorporated herein by this reference). However, that first piece of information does not lead to patterning, and has not be successful for high resolution pattern transfer for three reasons:

a) The metallic content of the photoresist film due to the presence of Sb in the onium salt used as sensitizer in the standard resist formulation, is high enough that residues remain between patterns, and a bad etching selectivity between silylated and non-silylated areas is observed The standard version of EPR photoresist cannot be used for silylation due to the above-mentioned problem of residues.

b) The silicon incorporated by the suggested silylating agent is not enough to withstand the dry development. The sylating agent used is too big and has too many chlorine atoms for efficient silicon incorporation.

c) The rinsing solvent was not a good solvent of the silylating agent, and residues were left on top of the photoresist after the end of the silylating reaction, by precipitation of the silylating agent or its hydrolysis products.

The present invention is concerned with a process whereby an epoxy-containing film is in situ made plasma-resistant by incorporating metals in it, in particular silicon. Silylation or other suitable element incorporation (element forming an in situ mask in the oxygen plasma, such as W, Ti, Sb, Al, Cu, Mo, etc) can be of blanket type if no radiation exposure of the film is done. Alternatively, an exposure can be done in an imagewise manner with light or other electromagnetic radiation ranging from below 1000 nm to hard x-rays, and with electron or ion beams. The radiation or the beams can penetrate the entire depth of the film or only the top few tens of nanometers. A post exposure baking treatment crosslinks the exposed areas, providing a diffusion barrier to silylation reagents. Silylation (or other suitable element incorporation) then takes place selectively in the unexposed areas. The image can be transferred to the film by an oxygen atom-containing plasma. High resolution and high fidelity pattern transfer can be achieved with this process.

The present invention is also concerned with the specific form of radiation. Should the radiation or beam penetration be only superficial (e.g. UV radiation below 200 nm, low energy -below 10 keV-electron beams, or ion beams) the process requires careful control of the amount of crosslinking, such that the stress mismatch between the top "slice" of the crosslinked material and the underlying non-crosslinked material does not cause pattern deformation. One criterion is the difference/mismatch between the glass transition temperatures of the top and bottom film slices, which should be less than 70° C. The control of the crosslinking is accomplished by keeping the post exposure baking temperature below certain values ($T_g$+70° C.), and/or reducing the amount of sensitizer, or changing to a less strong sensitizer.

The present invention is also concerned with the epoxy material. The epoxy resin material may include a sensitizer such as an onium salt. However, the total initial metallic (or other element which gives non volatile oxides in the plasma, and causes grass formation) content of the film should be less than 5%, and preferably less than 2%, otherwise residues exist after the dry development step between the patterns.

The present invention is also concerned with the silylating media. The silylating agents used in these media are reactive with the epoxy ring. Such reagents include halogen-silanes. The silylation reaction can be done from the gas phase containing vapors of the silylating agents, or from the liquid phase with a silylating solution of appropriate composition of a silylating agent, an aprotic solvent of the film and the silylating agent, and an aprotic inert carrier which is a solvent for the silylating agent, but only partial solvent of the film.

The foregoing and other objects, features and advantages of the invention will be apparent from the following more particular description of preferred embodiments of the invention. All percentages and parts are by weight unless otherwise stated.

DETAILED DESCRIPTION OF THE INVENTION

The film can be applied from polymer or oligomer or photoresist solutions, and may contain any type of epoxy functionalities. Preferred films are those containing glycidyl ethers or esters of aromatic or aliphatic alcohols or acids.

The film may contain sensitizers, such as onium salts of the sulfonium or iodonium type. However if the sensitizer contains an element such as antimony, which forms an in situ mask (and therefore causes grass formation) in the plasma, or if the polymer itself contains such elements, the total content of the films should be less than 5% per weight.

The imagewise exposure to radiation (if desired) can be done with UV, DUV, 193 mn, 157 nm, VUV, EUV, x-rays, electron beams with energy greater than 10 kV, low energy electron beams below 10 kV, and ion beams.

The post exposure bake is preferably done at a temperature above the glass transition temperature of the film ($T_g$). However, in order to ensure high resolution patterning, and to avoid pattern deformation due to stress mismatch in the case of only top surface imaging of the film by non-penetrating radiation or beams, the temperature should be limited to below $T_g$+70° C. Equivalent effect to the temperature has the selection of more or less "powerful" sensitizer or the reduction of the amount of sensitizer.

Silylating agents are agents that react with the epoxy ring. In particular mono or bi or multifunctional halo-silanes can be used of the type $Si_nR_1R_2 \ldots R_{2n+2-m}X_m$, where n and m can be one or more, but for each Si atom m is preferably less than 2, and Si is silicon or other metal, R can be hydrogen, methyl, ethyl, and in general alkyl or alkylated siloxy groups, and X is a halogen atom, such as chlorine. In general small molecules containing one or two Si atoms, one or two chlorine atoms, one or two methyl groups, and hydrogen atoms are best suited for film silylation. Large molecules have difficulties to diffuse into the film, even if they could react with the photoresist in solution. Typical agents are chlorosilane, methylchlorosilane, dimethylchlorosilane, dimethyl dichlorosilane. Bifunctional agents or their mixtures with mono functional agents are preferred, since they cause some crosslinking in the silylated region, and thus do not lower the $T_g$ of the silylated film, which could cause pattern deformation during gas phase silylation, and during the dry development step, when heating of the film might take place.

silylation or other element giving an in situ mask in the oxygen plasma can be done from the gas phase, where the silylating agent (or other element agent) is diffusing and reacting in the film from the vapor phase. In this case, heating of the film is required above its $T_g$.

Silylation or other element giving an in situ mask in the oxygen plasma can be also done from the liquid phase. A silylating solution should contain the silylating agent (or other element agent), an aprotic solvent of both the agent and the film, and an inert carrier aprotic solvent of the agent but not the film. Silylation can be done at room temperature, as puddle silylation, or immersion of the surface to be silylated in the silylating solution. Silylation is best carried out under low and controlled humidity conditions, since the silylating agents are sensitive to humidity. Following liquid phase silylation rinsing with an appropriate solvent that does not dissolve the film, and does not precipitate the silylating agent should be done. Finally a post silylation drying with nitrogen, and a baking step is done, to remove solvents.

Dry development is carried out in an oxygen-containing plasma, in one or two steps, where the first step contains some fluorine liberating gas, in order to improve the selectivity between silylated and non silylated areas. The second plasma step does not containing fluorine atoms, but could contain hydrogen or sulfur atoms in addition to oxygen atoms for best anisotropy and less roughness. Critical is the control of the temperature of the film during the plasma-processing step. It must be efficiently cooled, so that the temperature does not exceed the $T_g$ of the silylated material more than a few tens of degrees. For perfect anisotropy cryogenic temperatures are recommended.

EXAMPLE 1

An epoxy novolak with a molecular weight $M_n$ of approximately 1200, containing 1% hexafluoroantimonate triphenyl sulfonium salt, is spin-coated on silicon wafers resulting in a 0.5–1 micron thick film. The film is prebaked at 110° C. for 4 min and exposed through a mask to DUV broadband radiation. Baking follows at 110° C. for 4 min in order to crosslink the exposed areas. Liquid phase silylation at room temperature is done for 90–120 s with a solution of 5% dimethyl dichloro silane, 15% propylene glycol methyl ether acetate, and 80% n-decane. Rinsing of the film is done with 50% v/v n-decane and xylene to stop the reaction, and a bake at 50° C. for 1 min. Dry development is done in an RIE reactor at 10–20 mTorr, 0.57 W/cm$^2$ rf power at 13.56 MHz at two steps: a) 5% SF$_6$, 5% CHF$_3$, 90% O$_2$ for 5–10% of the total development time, and b) 100% O$_2$ for 90–95% of the total development time. During the plasma-etching step the wafer temperature was controlled to be below 80° C. Sub half micron patterns result from this process.

EXAMPLE 2

Similar to example 1, except that the exposure is carried out with a 50 keV electron beam. This process resulted in sub 0.15 micron resolution.

EXAMPLE 3

An epoxy novolak containing 0.75–0.3 % hexafluoroantimonate triphenyl sulfonium salt, is spin-coated on silicon wafers resulting in a 0.5–0.7 micron thick film. The film is prebaked at 130° C. for 4 min and imagewise exposed with 193 nm radiation. The light penetrates only the top 20–50 nm of the film. Baking should follow below 110° C. for 4 min, and preferably at 100° C., in order to crosslink the exposed areas without causing strong stress mismatch. Strong pattern deformation is observed at higher temperatures, and/or higher antimonate contents. Liquid phase silylation at room temperature is done for 100s with a solution of 5% dimethyl dichloro silane, 15%propylene glycol methyl ether acetate, and 80% n-decane. Rinsing of the film is done with 50% v/v n-decane and xylene to stop the reaction, and a bake at 50° C. for 1 min. Dry development is done in an RIE reactor at 10–20 mTorr, 0.57 W/cm$^2$ rf power at 13.56 MHz at two steps: a) 5% SF$_6$, 5% CHF$_3$, 90% O$_2$ for 5–10% of the total development time, and b) 100% O$_2$ for 90–95% of the total development time. During the plasma-etching step the wafer temperature was controlled to be below 80° C. Sub 0.20 micron patterns can be resolved with this process.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A process for transferring a positive tone pattern onto a substrate, said method comprising the steps of:
   (a) forming an epoxy polymer film on the substrate, thereby forming a coated substrate;
   (b) exposing the coated substrate to a radiation source imagewise, thereby producing one or more exposed regions of said epoxy polymer film and one or more unexposed regions of said epoxy polymer film;
   (c) contacting the coated substrate with a silylating agent selected from the group consisting of halosilanes with no carbon atoms, halosilanes with alkyl groups having less than three carbon atoms, halopolysilanes, haloalkylsiloxysilanes, haloalkylsiloxypolysilanes, chlorosilane, methylchlorosilane, dimethylchlorosilane and dimethyldichlorosilane, under conditions sufficient for silylation of the unexposed area or areas of the epoxy polymer film and essentially no silylation of the exposed region or regions, thereby producing one or more silylated regions of the epoxy polymer film and one or more unsilylated regions of the epoxy polymer film;
   (d) developing the coated substrate to remove the unsilylated region or regions of said film from the substrate; whereby the positive tone pattern is transferred onto the substrate.

2. The process of claim 1, wherein the epoxy polymer film contains a sensitizer and the total content of the eidoxy polymer film is less than 5% in elements which can form an in situ mask and cause residue/grass formation in the oxygen plasma.

3. The process of claim 2, wherein the sensitizer is an onium salt.

4. The process of claim 1, wherein the radiation comprises x-rays or electron beams or ion beams.

5. The process of claim 1, wherein the silylating agent of step (c) is in the vapor phase or the liquid phase.

6. The process of claim 5, wherein the silylating agent of step (c) is in a solution, said solution comprising from 5–50% per weight of the silylating agent and an aprotic solvent.

7. The process of claim 6, wherein the aprotic solvent is propylene glycol methyl ether acetate.

8. The process of claim 6, wherein the solution further comprises xylene and n-decane.

9. The process of claim 5 wherein the silylating agent is in solution and the process further comprises the step of rinsing the coated substrate with an aprotic solvent for the silylating agent following step (c).

10. The process of claim 9, wherein the rinsing solvent comprises one or more aromatic hydrocarbons, one or more aliphatic hydrocarbons, or a mixture thereof.

11. The process of claim 1, wherein the epoxy polymer film comprises glycidyl ether groups or glycidyl ester groups.

12. The process of claim 1, further comprising the step of:
    (e) heating the coated substrate following step (b), thereby crosslinking the epoxy polymer in the exposed region or regions.

13. The process of claim 1 wherein the coated substrate is developed by contacting the coated substrate with a plasma comprising oxygen atoms.

14. The process of claim 13 wherein the plasma further comprises sulfur atoms, hydrogen atoms, or a combination thereof.

15. The process of claim 1 wherein the coated substrate is developed by contacting the coated substrate with a first plasma comprising oxygen atoms and fluorine atoms and then a second plasma comprising oxygen atoms.

16. The process of claim 15 wherein said second plasma further comprises sulfur atoms, hydrogen atoms or a combination thereof.

17. A process for transferring a positive tone pattern onto a substrate, said method comprising the steps of:
    (a) forming an epoxy polymer film on the substrate, thereby forming a coated substrate;
    (b) exposing the coated substrate to radiation imagewise, wherein said radiation is selected from the group consisting of ultraviolet radiation below 200 nm, electron beams of energy below about 10 KeV and ion beams, thereby producing one or more exposed regions of said epoxy polymer film and one or more unexposed regions of said epoxy polymer film;
    (c) baking the coated substrate, thereby crosslinking the exposed region or regions of the epoxy polymer film;
    (d) contacting the coated substrate with a silylating agent selected from the group consisting of halosilanes with no carbon atoms, halosilancs with alkyl groups having less than three carbon atoms, halopolysilanes, haloalkylsiloxysilanes, haloalkylsiloxypolysilanes, chlorosilane, methylchlorosilane, dimethylchlorosilane and dimethyldichlorosilane, under conditions sufficient for silylation of the unexposed area or areas of the epoxy polymer film and essentially no silylation of the exposed region or regions, thereby producing one or more silylated regions of the epoxy polymer film and one or more unsilylated regions of the epoxy polymer film; and
    (e) contacting the coated substrate with a plasma comprising oxygen atoms, thereby removing the unsilylated region or regions of said film from the substrate; whereby the positive tone pattern is transferred onto the substrate.

18. The process of claim 17, wherein the plasma further comprises sulfur atoms, hydrogen atoms or a combination thereof.

19. The process of claim 18 further comprising the step of contacting the coated substrate with a plasma comprising oxygen atoms and fluorine atoms prior to step (e).

20. The process of claim 17, wherein the epoxy polymer film comprises glycidyl ether groups or glycidyl ester groups.

21. The process of claim 17, wherein the epoxy polymer film comprises an onium salt.

22. The process of claim 17 further comprising the step of contacting the coated substrate with a plasma comprising oxygen atoms and fluorine atoms prior to step (e).

23. The process of claim 17, wherein the silylating agent of step (d) is in a solution comprising from 5 to 50% by weight of the silylating agent and an aprotic solvent.

24. The process of claim 23 wherein the aprotic solvent is propylene glycol methyl ether acetate.

25. The process of claim 17 wherein the silylating agent is in solution and the process further comprises the step of rinsing the coated substrate with a solvent for the silylating agent following step (c).

26. The process of claim 25, wherein the rinsing solvent comprises one or more aromatic hydrocarbons, one or more aliphatic hydrocarbons, or a mixture thereof.

27. A process for transferring a positive tone pattern onto a substrate, said method comprising the steps of:
    (a) forming an epoxy polymer film on the substrate, thereby forming a coated substrate;
    (b) exposing the coated substrate to a radiation source imagewise, thereby producing one or more exposed regions of said epoxy polymer film and one or more unexposed regions of said epoxy polymer film;
    (c) contacting the coated substrate with a compound comprising a metal selected from the group consisting of tungsten, titanium, antimony, aluminum, copper and molybdenum, under conditions sufficient for metallation of the unexposed area or areas of the epoxy polymer film and essentially no metallation of the exposed region or regions, thereby producing one or more metalated regions of the epoxy polymer film and one or more unmetallated regions of the epoxy polymer film;
    (d) developing the coated substrate to remove the unmetalated region or regions of said film from the substrate; whereby the positive tone pattern is transferred onto the substrate.

28. A process for silylating an epoxy polymer film on a substrate, said method comprising the steps of:
    (a) providing a substrate coated with an epoxy polymer film; and
    (b) contacting the coated substrate with a silylating agent selected from the group consisting of halosilanes with no carbon atoms, halosilanes with alkyl groups having less than three carbon atoms, halopolysilanes, haloalkylsiloxysilanes, haloalkylsiloxypolysilanes, chlorosilane, methylchlorosilane, dimethylchlorosilane and dimethyldichlorosilane, under conditions sufficient for silylation of the epoxy polymer film.

* * * * *

UNITED STATES PATENT AND TRADEMARK OFFICE
CERTIFICATE OF CORRECTION

PATENT NO. : 6,296,989 B1
DATED : October 2, 2001
INVENTOR(S) : Evangelos Gogolides, Evangelia Tegou, Panagiotis Argitis, and Michael Hatzakis It is certified that error appears in the above-identified patent and that said Letters Patent is hereby corrected as shown below:

Claim 2,
Line 58, "eidoxy" should read -- epoxy --.

Signed and Sealed this

Twelfth Day of March, 2002

Attest:

JAMES E. ROGAN
Attesting Officer
Director of the United States Patent and Trademark Office